(12) United States Patent
Ho et al.

(10) Patent No.: US 7,863,995 B2
(45) Date of Patent: Jan. 4, 2011

(54) METHODS OF ACHIEVING LINEAR CAPACITANCE IN SYMMETRICAL AND ASYMMETRICAL EMI FILTERS WITH TVS

(75) Inventors: Moses Ho, Campbell, CA (US);
Madhur Bobde, San Jose, CA (US);
Mike Chang, Cupertino, CA (US);
Limin Weng, Shanghai (CN)

(73) Assignee: Alpha & Omega Semiconductor Ltd. (BM)

( * ) Notice: Subject to any disclaimer, the term of this patent is extended or adjusted under 35 U.S.C. 154(b) by 487 days.

(21) Appl. No.: 12/080,104

(22) Filed: Apr. 1, 2008

(65) Prior Publication Data
US 2008/0310065 A1 Dec. 18, 2008

Related U.S. Application Data

(63) Continuation-in-part of application No. 11/820,072, filed on Jun. 16, 2007, now Pat. No. 7,795,987.

(51) Int. Cl.
*H04B 3/28* (2006.01)
*H01L 25/00* (2006.01)

(52) U.S. Cl. .................................. 333/12; 327/565

(58) Field of Classification Search .............. 333/12; 327/565

See application file for complete search history.

(56) References Cited

U.S. PATENT DOCUMENTS

| 4,342,013 | A | * | 7/1982 | Kallman | 333/181 |
| 5,780,905 | A | * | 7/1998 | Chen et al. | 257/355 |
| 2003/0228848 | A1 | * | 12/2003 | Escoffier et al. | 455/91 |

* cited by examiner

*Primary Examiner*—Evan Pert
(74) *Attorney, Agent, or Firm*—Bo-In Lin

(57) ABSTRACT

A transient voltage suppressing (TVS) circuit with uni-directional blocking and symmetric bi-directional blocking capabilities integrated with an electromagnetic interference (EMI) filter supported on a semiconductor substrate of a first conductivity type. The TVS circuit integrated with the EMI filter further includes a ground terminal disposed on the surface for the symmetric bi-directional blocking structure and at the bottom of the semiconductor substrate for the uni-directional blocking structure and an input and an output terminal disposed on a top surface with at least a Zener diode and a plurality of capacitors disposed in the semiconductor substrate to couple the ground terminal to the input and output terminals with a direct capacitive coupling without an intermediate floating body region.

23 Claims, 4 Drawing Sheets

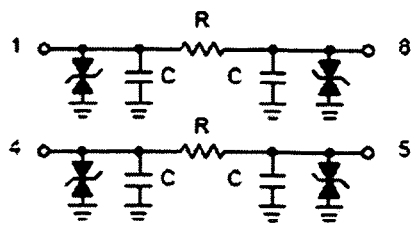
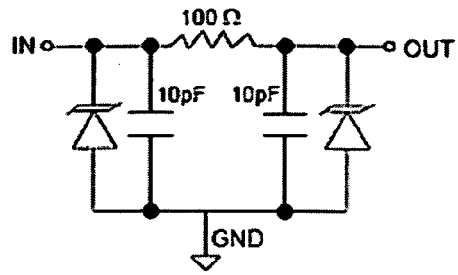
Fig. 1A   Fig. 1B
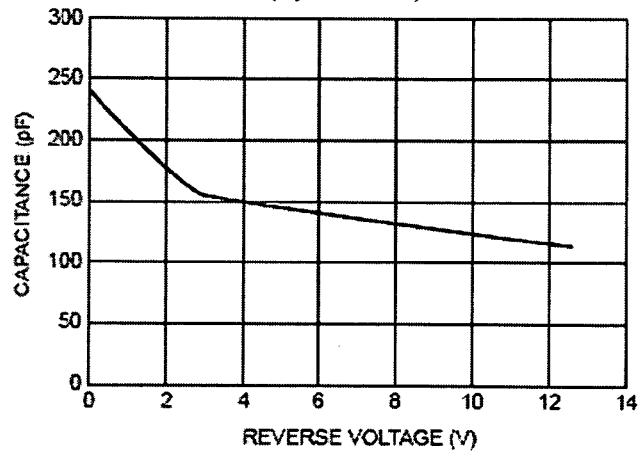
Fig. 1C
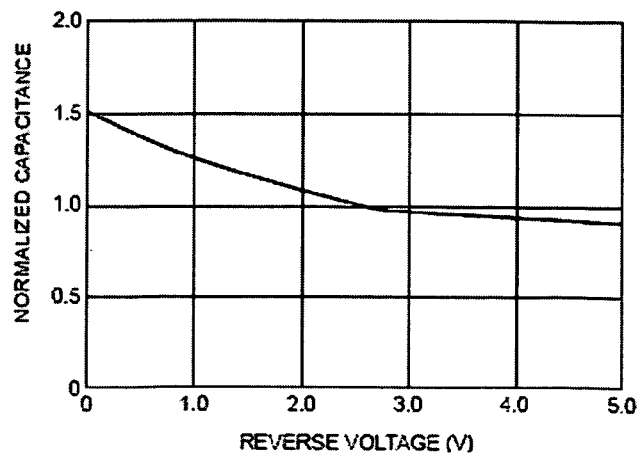
Fig. 1D

METHODS OF ACHIEVING LINEAR CAPACITANCE IN SYMMETRICAL AND ASYMMETRICAL EMI FILTERS WITH TVS

This application is a Continuation in Part (CIP) Application and claims priority to U.S. patent application entitled "METHODS OF ACHIEVING LINEAR CAPACITANCE IN SYMMETRICAL AND ASYMMETRICAL EMI FILTERS WITH TVS" filed on Jun. 16, 2007 now U.S. Pat. No. 7,795,987 and accorded Ser. No. 11/820,072 by one of common Applicants of this Application, the benefit of its filing date being hereby claimed under Title 35 of the United States Code.

BACKGROUND OF THE INVENTION

1. Field of the Invention

The invention relates generally to a circuit configuration and method of manufacturing filtering circuits with capacitors including the transient voltage suppressor (TVS). More particularly, this invention relates to an improved circuit configuration and method of manufacturing the filtering circuits implemented with resistor-capacitor (RC) or inductor capacitor (LC) with increased capacitances for a symmetrical bi-directional blocking transient voltage suppressor (TVS) that includes Zener diodes and Zener diode triggered bipolar transistors.

2. Description of the Relevant Art

The conventional technologies for designing and manufacturing a filtering circuit with resistor-capacitor (RC) or inductor-capacitor (LC) are challenged by a requirement to increase the capacitance for achieving a filtering effect. For the purpose of increasing the capacitance, typical method applied by those of ordinary skill in the art is to increase the junction areas. However, the method leads to undesirable device designs and degraded performances due to the facts that the devices implemented with such method further have a large die size or a thicker oxide layer in the trench.

In addition to these technical challenges, the convention technologies for designing and manufacturing the filtering circuits such as an electromagnetic interference (EMI) filter combined with a transient voltage suppressor (TVS) is still confronted with a technical difficulty that the filtering performance may become unreliable due to variation of the capacitance as now implemented in the EMI filter. Specifically, as will be further discussed below, the variations of the capacitance may be induced through change in the bias voltage and several environmental effects including light and noise. For audio signal receptions, the quality of the incoming signal receptions may be adversely affected when the functions performed by the EMI filters cannot be precisely controlled. Specific functional parameters for signal reception such as the cutoff frequency may be changed due to the variation of the capacitance in the EMI filter when the conditions of the operational environment are changed. Therefore, an urgent demand is now required to provide an effective solution to such problems.

Specifically, a transient voltage suppressing (TVS) circuit is often implemented with an electromagnetic interference (EMI) filter for application of an audio signal reception. The TVS is implemented with an EMI filter that can have either a symmetrical or an asymmetrical configuration as that shown in FIG. 1A or 1B respectively. The EMI filters as shown are implemented with a combination of resistor-capacitor (RC) and resistor-inductor (RL) and integrated with a combined TVS. The EMI filter and TVS integrated circuit are implemented as a monolithic device thus provides advantages that the EMI filter when implemented with TVS has better filtering performance. Typically in a low pass filter to attenuate the cellular band signals in a range of 800 MHz to 3 GHz, an attenuation of at least 35 dB can be achieved. Furthermore, such device has low parasitic resistance, capacitance and inductance.

In the EMI filter implemented with TVS shown in FIGS. 1A and 1B, the capacitance as that required by the EMI filter is typically provided by implementing a Zener diode in the filter and the Zener diode has an inherent junction capacitance. Thus, the diode junction capacitance in the Zener diode implemented in the TVS is also available to function as a capacitor for the EMI filter. However, the junction capacitance of the Zener diode as implemented is also a function of the biased voltage. For the purpose of designing the EMI filters as that shown in FIGS. 1A and 1B, the bias voltage for the symmetrical filter is zero volts and for the bias voltage of the asymmetrical filter is Vcc/2, where Vcc is the supply voltage. However, the capacitance may vary due the bias voltage and that can cause the filter cutoff frequency to vary with the DC bias thus leads to unreliable filtering performance. FIGS. 1C and 1D illustrate measurements of the capacitance variations in symmetric and asymmetric filters as a function of DC bias for a chip-scale package (CSP) and a DFN (DualFlat No Lead) package.

When a symmetrical blocking structure is implemented with the symmetrical EMI filter shown in FIG. 1A, the implementation of the Zener diode is configured to use a floating junction as a result of which the capacitance of the diode junction is very sensitive to the environmental conditions such as light and noise in addition to the variations of the capacitance that is dependent on the DC bias. When the EMI and TVS integrated device is packaged as a chip-scale package (CSP), the integrated EMI-TVS as implemented would require a high capacitance tolerance value of as much as 20% in order to maintain reliable filtering performance with the variation in environment conditions such as light.

Therefore, a need still exists in the fields of circuit design and device manufactures for providing a new and improved circuit configuration and manufacturing method to resolve the above-discussed difficulties. Specifically, a need still exists to provide new and improved EMI filter combined with a TVS that can provide linear and controllable capacitance such that the limitations and difficulties can be resolved.

SUMMARY OF THE PRESENT INVENTION

It is therefore an aspect of the present invention to provide a filtering circuit implemented with RC and/or LC circuits such as a TVS protection circuit with integrated EMI filter by providing dielectric layers with new and improved dielectric layers by combining nitride and oxide layers of adjustable thickness of these layers such that the capacitance can be flexibly increased to achieve the required filtering capacitance without increasing the die junction areas or increasing oxide thickness. The above-discussed technical difficulties encountered in the conventional filtering circuits are therefore resolved.

It is another aspect of the present invention to provide a TVS protection circuit with integrated EMI filter by providing an improved device configuration for the total capacitance between the input terminal and a ground terminal to remain substantially at a constant value such that the above discussed limitations and difficulties as encountered in the conventional technologies may be resolved.

Specifically, one aspect of this invention is to form a TVS circuit integrated with an EMI filter with at least a Zener diode and a plurality of capacitors connected in parallel between an input terminal and a ground terminal wherein the capacitors having a total capacitance maintaining at substantially at a constant value when different biased voltages are applied to the input terminal and the ground terminal.

Another aspect of this invention is to form a TVS circuit integrated with an EMI filter on a semiconductor substrate by forming a doping region to function with the semiconductor substrate as a Zener diode and to open two sets of trenches filled with a dielectric material and a polysilicon gate, padded by a nitride dielectric (Si3N4) layer and an oxide dielectric (SiO2) layer, to function as MOS (Metal-Oxide-Semiconductor) capacitors wherein the number of MOS capacitors with gate terminal connected to an input terminal is substantially equal to the number of MOS capacitors with gate terminal connected to the ground terminal such that the total capacitance is kept at substantially a constant value at different bias voltages applied to the input terminal and the ground terminal. Similarly, two doped regions are formed in the output side of the device with the doped regions to function as Zener diodes. Two sets of trenches filled with dielectric material and a polysilicon gate, padded by a nitride dielectric (Si3N4) layer and an oxide dielectric (SiO2) layer, are opened in the doped regions to function as MOS capacitors wherein the number of MOS capacitors with gate terminal connected to an output terminal is substantially equal to the number of MOS capacitors with gate terminal connected to the ground terminal such that the total capacitance between the output terminal and the ground terminal is kept substantially at a constant value when different bias voltages are applied between the output terminal and the ground terminal.

Briefly in a preferred embodiment this invention discloses an electronic device protected by a transient voltage suppressing (TVS) circuit integrated with an electromagnetic interference (EMI) filter. The TVS circuit integrated with the EMI filter further includes at least a Zener diode connected in parallel to a plurality of capacitors between an input terminal and a ground terminal wherein a total capacitance between the input terminal and the ground terminal having substantially a constant value when applying opposite bias voltages between the input terminal and the ground terminal. In an exemplary embodiment, the EMI filter further includes a symmetrical filter having an equal number of capacitors connected to the input terminal and to the ground terminal. In a specific exemplary embodiment, the TVS integrated with the EMI filter is supported on a semiconductor substrate and the plurality of capacitors includes a plurality of shallow trenches opened in semiconductor substrate filled with a dielectric material and padded by a nitride dielectric (Si3N4) layer and an oxide dielectric (SiO2) layer. In another exemplary embodiment, the TVS integrated with the EMI filter is supported on a semiconductor substrate and the EMI filter further includes a symmetrical filter having an equal number of shallow trenches opened in the semiconductor substrate for functioning as capacitors, and padded by a nitride dielectric (Si3N4) layer and an oxide dielectric (SiO2) layer, connected to the input terminal and to the ground terminal. In another exemplary embodiment, the TVS integrated with the EMI filter is supported on a semiconductor substrate wherein the input terminal is formed in a first doped region in the semiconductor substrate and the ground terminal is formed in a second doped region in the semiconductor substrate; and the semiconductor substrate further including deep isolation trenches disposed between the first and second doped regions. In another exemplary embodiment, the TVS integrated with the EMI filter is supported on a semiconductor substrate of a first conductivity type and the input terminal is formed in a first doped region in the semiconductor substrate and the ground terminal is formed in a second doped region in the semiconductor substrate wherein the first and second doped regions are doped with a second conductivity type whereby a first and second Zener diodes are formed between the first and second doped regions of the second conductivity type and the semiconductor substrate of the first conductivity type.

This invention further discloses a transient voltage suppressing (TVS) circuit integrated with an electromagnetic interference (EMI) filter supported on a semiconductor substrate of a first conductivity type. In case of the symmetric blocking structure, the TVS circuit integrated with the EMI filter includes a ground terminal disposed on the top surface and an input and an output terminal disposed on a top surface with at least a Zener diode and a plurality of capacitors disposed in the semiconductor substrate to couple the ground terminal to the input and output terminals with a direct capacitive coupling without an intermediate floating body region. In an exemplary embodiment, the TVS circuit integrated with the EMI filter further includes two laterally spaced doped regions of one conductivity type placed in a material of a second conductivity type in order to form a bi-directional blocking Zener diode. The first doped region is contacted to form the input terminal, and the second doped region is contacted to form the ground terminal. Further, a first set of trenches filled with dielectric material and a polysilicon gate, padded by a nitride dielectric (Si3N4) layer and an oxide dielectric (SiO2) layer, are placed in the first doped region and the polysilicon gate is connected with the ground terminal. This forms the first set of MOS capacitors between the input terminal and the ground terminal. Similarly, a second set of trenches filled with dielectric material and a polysilicon gate are placed in the second doped region and the polysilicon gate is connected to the input terminal. This forms the second set of MOS capacitors from the input to ground terminal, and has the opposite connectivity as compared to the first set of trench MOS capacitors. The same scheme is repeated in order to form the Zener diodes and the MOS capacitors between the output and the ground terminal. Another two laterally spaced doped regions of one conductivity type placed in a material of a second conductivity type in order to form a bi-directional blocking Zener diode. The fourth doped regions is contacted to form the output terminal, and the third doped region is contacted to form the ground terminal. Further, a third set of trenches filled with dielectric material and a polysilicon gate, padded by a nitride dielectric (Si3N4) layer and an oxide dielectric (SiO2) layer, are placed in the third doped region and the polysilicon gate is connected with the output terminal. This forms the first set of MOS capacitors between the output terminal and the ground terminal. Similarly, a fourth set of trenches filled with dielectric material and a polysilicon gate, padded by a nitride dielectric (Si3N4) layer and an oxide dielectric (SiO2) layer, are placed in the fourth doped region and the polysilicon gate is connected to the ground terminal. This forms the second set of MOS capacitors from the output to ground terminal, and has the opposite connectivity as compared to the first set of trench MOS capacitors. The second and third doped regions are both ground terminals, and are shorted together with metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A to 1B are circuit diagram of the EMI filter combined with TVS circuit.

FIGS. 1C and 1D are diagram for showing the variation of the capacitance due to the change of the DC bias voltage.

DETAILED DESCRIPTION OF THE METHOD

Figure 2:
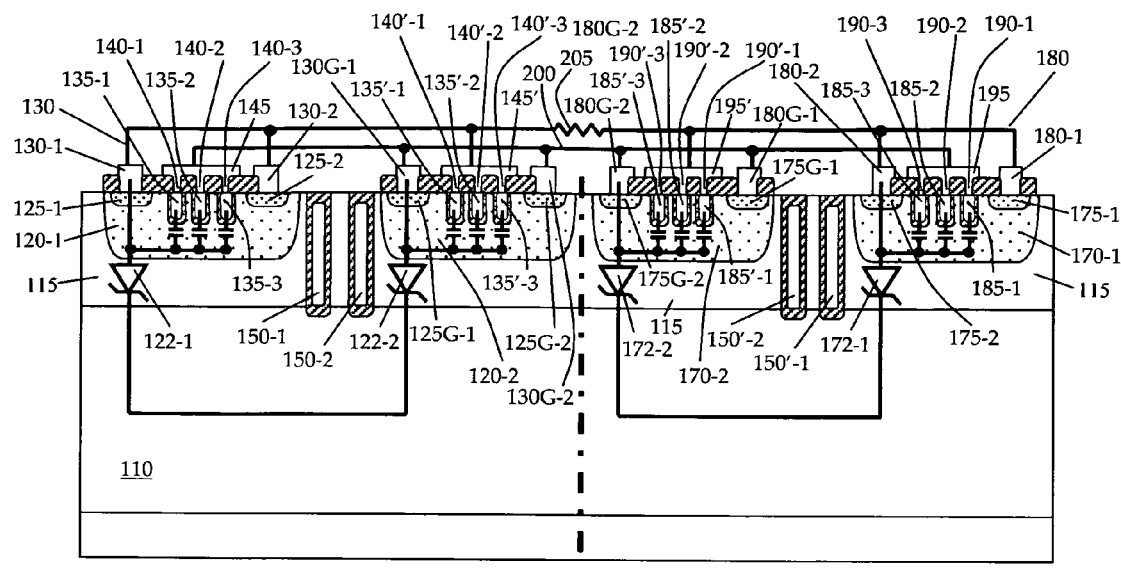
FIG. 2 shows a side cross sectional view for a symmetrical EMI filter combined with a TVS of this invention.

Referring to FIG. 2 for a symmetrical EMI filter combined with a TVS of this invention. The symmetrical EMI filter combined with a TVS is supported on a N+ substrate 110 with an N-epitaxial layer 115 and shown with an input side on the left and an output side on the right. The input side of the substrate is doped with a first body region 120-1 and a second body region 120-2 with a P-type dopant. A Zener diode 122-1 is formed between the first doped body region 120-1 and the N-epitaxial layer 115. Another Zener diode 122-2 is formed between the second doped body region 120-2 and the N-epitaxial layer 115. The first body region 120-1 is formed with first contact dopant region 125-1 and a second contact dopant region 125-2 for electrical contacting the electrodes 130-1 and 130-2 for receiving an input voltage therein. The first body region 120-1 further has multiple shallow trenches 135-1, 135-2 and 135-3 filled with dielectric material and a polysilicon gate to function as MOS capacitors. The trench capacitors 135-1, 135-2, and 135-3 are electrically connected to the ground terminal through metal contacts 140-1 to 140-3 to a contact metal 145 disposed over the top surface of the substrate and the contact metal is connected to the ground terminal. The second body region 120-2 is also formed with a first contact dopant region 125G-1 and a second contact dopant region 125G-2 for electrical contacting the electrodes 130G-1 and 130G-2 for electrically contacting the ground voltage. The second body region 120-2 further has multiple shallow trenches 135'-1 to 135'-3 filled with dielectric material and a polysilicon gate to function as MOS capacitors. The shallow trenches 135'-1 to 135'-3 are electrically connected to the input voltage through metal contacts 140'-1 to 140'-3 respectively and then through contact metal 145' disposed over the top surface of the substrate. There are two deep isolation trenches 150-1 and 150-2 disposed between the first and second body regions 120-1 and 120-2. The deep trenches 150-1 and 150-2 are used for isolation purposes. The device structure has a lateral parasitic PNP transistor. Addition of deep trenches in the base region of the lateral PNP will significantly reduce the gain of the parasitic transistor thereby removing any undesirable current path.

The output side of the substrate is also doped with a first body region 170-1 and a second body region 170-2 with a P-type dopant. The first body region 170-1 is formed with first contact dopant region 175-1 and a second contact dopant region 175-2 for electrical contacting the electrodes 180-1 and 180-2 for providing an output voltage. A Zener diode 172-1 is formed between the first doped body region 170-1 and the N-epitaxial layer 115. Another Zener diode 172-2 is formed between the second doped body region 170-2 and the N-epitaxial layer 115. The first body region 170-1 further has multiple shallow trenches 185-1 185-2 and 185-3 filled with dielectric material and a polysilicon gate to function as MOS capacitors. The shallow trenches 185-1 to 185-3 are electrically connected to the ground terminal through metal contacts 190-1 to 190-3 respectively and then through the contact metal 195 disposed over the top surface of the substrate. The second body region 170-2 is also formed with a first contact dopant region 175G-1 and a second contact dopant region 175G-2 for electrical contacting the electrodes 180G-1 and 180G-2 for electrically contacting the ground voltage. The second body region 170-2 further has multiple shallow trenches 185'-1 to 185'-3 filled with dielectric material and a polysilicon gate to function as MOS capacitors. The shallow trenches 185'-1 to 185'-3 are electrically connected to the output voltage through metal contacts 190'-1 to 190'-3 respectively and then through the contact metal 195' disposed over the top surface of the substrate. The two ground body regions 120-2 and 170-2 are shorted together with metal 200. The input and the output terminals 130 and 180 are interconnected with a series resistor 205 formed by a polysilicon layer to function as a filter resistor between the input and the output terminals of the EMI-TVS device. There are two deep isolation trenches 150'-1 and 150'-2 disposed between the first and second body regions 170-1 and 170-2. The deep trenches 170-1 and 170-2 are used for isolation purposes. The device structure has a lateral parasitic PNP transistor. Addition of deep trenches in the base region of the lateral PNP will significantly reduce the gain of the parasitic transistor thereby removing any undesirable current path.

Figure 2A:
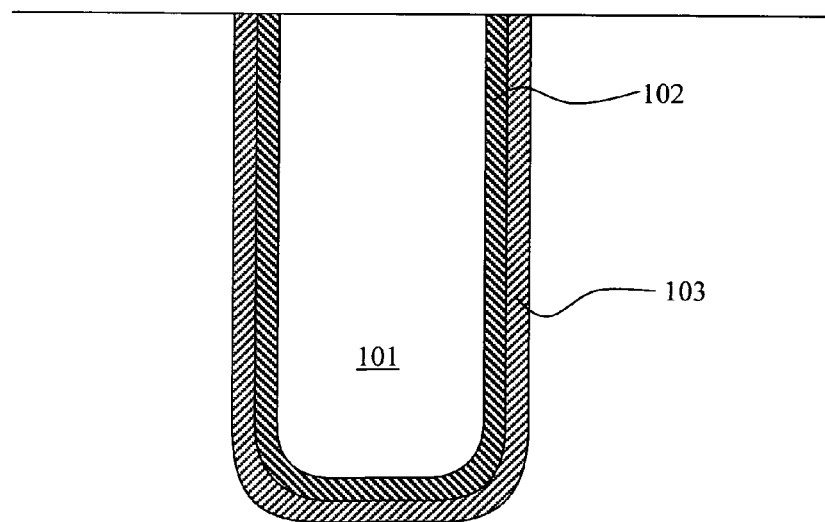
FIG. 2A is a cross sectional view of an exemplary embodiment wherein the MOS trenched capacitors are formed with polysilicon filled trenches padded with combined dielectric layer of a nitride dielectric (Si3N4) layer and an oxide dielectric (SiO2) layer.

Referring to FIG. 2A for particular embodiment of this invention wherein the MOS capacitors, i.e., the shallow trenches 135-1 to 135-3, 135'-1 to 135'-3, 185-1 to 185-3 and 185'-1 to 185'-3, are filled with a polysilicon gate material 101 padded with a combined dielectric layer that includes a nitride dielectric layer 102 and an oxide dielectric layer 103. The oxide dielectric layer 103 is applied to release the film stress of the nitride dielectric layer on the silicon surface. With the combined dielectric layer includes a nitride dielectric layer 102 and an oxide dielectric layer 103 the capacitance can be further increased without increasing the junction areas. The dielectric constant of the silicon nitride is higher than the silicon oxide layer as shown in the table below. Therefore, for the same film thickness, the Si3N4 layer can provide a higher capacitance.

|  | SiO$_2$ | Nitride (Si$_3$N$_4$) |
| --- | --- | --- |
| Dielectric constant | 3.9 | 7.5 |
| Dielectric strength | 10$^7$ | 10$^7$ |

Figure 2B:
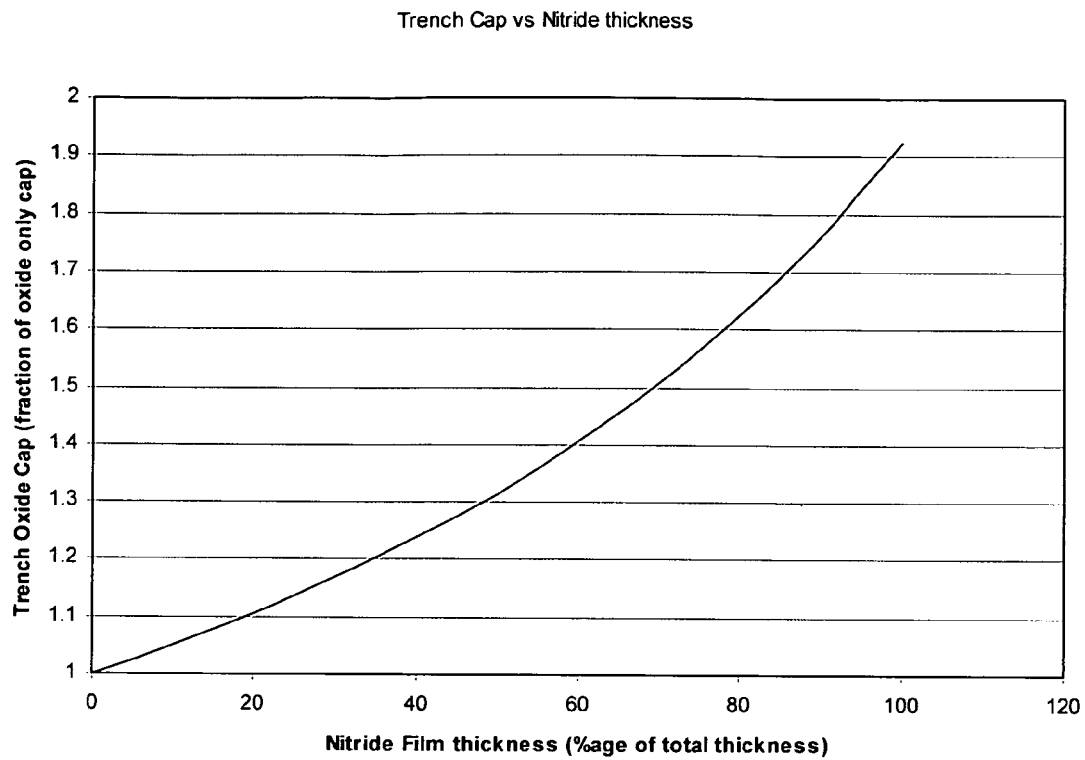
FIG. 2B shows the increase of the capacitance of the trench capacitor with increasing thickness of the nitride layer while keeping the total thickness of the combined dielectric layer of a nitride dielectric (Si3N4) layer and an oxide dielectric (SiO2) layer constant.

FIG. 2B shows the increase of the capacitance of the trench capacitor with increasing thickness of the nitride layer while keeping the total thickness of the combined dielectric layer of a nitride dielectric (Si3N4) layer and an oxide dielectric (SiO2) layer constant. Therefore, the capacitance of the filtering circuits can be flexibly adjusted by adjusting the thickness of the nitride dielectric layer while keeping the total thickness of the combined dielectric layer constant. Flexibilities and application ranges of the filtering circuits can be expanded and improved with such tunable capacitances by adjusting the relative thickness of the nitride and the oxide layers.

Figure 3:
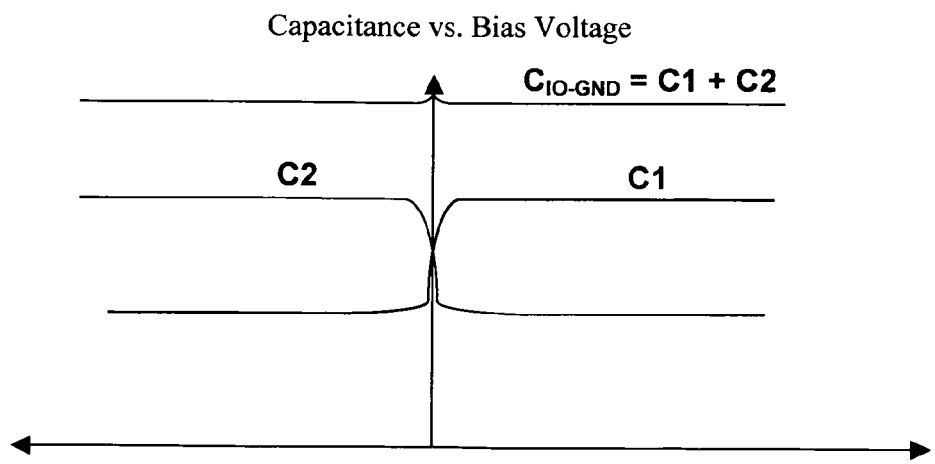
FIG. 3 is a diagram for illustrating the variation of capacitance as function of bias voltage and the total capacitance is kept substantially constant because the complimentary nature of the first and second capacitors now provide in the EMI-TVS device of this invention.

Referring to FIG. 3 for a diagram that illustrates the variations of capacitance versus voltage, i.e., a C-V diagram for MOS capacitor. The capacitance-voltage (C-V) diagram is FIG. 3 illustrates a typical C-V relationship for the trench capacitors. The capacitors are formed between the trench polysilicon in the shallow trenches. There are half of the trench capacitors with gate terminal connected to the input terminal and the other half of the trench capacitors with gate terminal connected to the ground. Therefore, C1 represents half of the total capacitance between the input terminal to the ground terminal and C2 represents another half of the total capacitance from the input terminal to the ground terminal. The variations of the capacitances C1 and C2 as that shown in the C-V curve therefore have a mirror image one to another. The total sum of these two capacitances C1 and C2, i.e., Ctotal=C1+C2, therefore maintains a constant value and is independent of the variation of the voltage. The symmetry of filtering operation is achieved by connecting one-half of the total number of trenches to the input the remaining number of trenches to the ground voltage.

Figure 4:
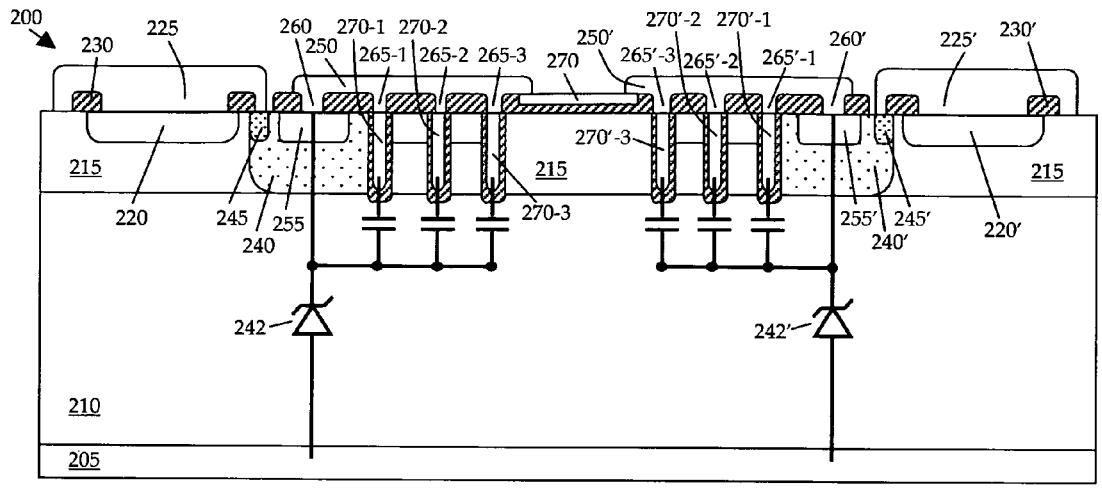
FIG. 4 shows a side cross sectional view for an asymmetrical EMI filter combined with a TVS of this invention

Referring to FIG. 4 for a side cross sectional view of an asymmetrical EMI filter combined with a TVS circuit 200 according to an improved device configuration of this invention. The EMI filter combined with a TVS circuit 200 is supported on a semiconductor substrate 210 having a bottom electrode 205 connected to a ground voltage. The EMI filter and TVS device 200 is shown with an input side on the left and an output side on the right. In the input side, the substrate 210 includes a plurality of trenches 270-1, 270-2 and 270-3 disposed in an N-epitaxial layer 215 supported on the N+ substrate 210. The trenches 270-1 to 270-3 with the epitaxial layer 215 are connected to the input voltage through metal contact 265-1 to 265-3 penetrates through an insulation layer 230. The Zener diode is implemented using a vertical NPN transistor which is triggered by a lateral Zener diode. The collector of the NPN is implemented with a N+ doped layer 255 and the base is implemented with a P doped layer 240. The emitter is implemented with the N+ doped substrate 210. The trigger for the NPN is implemented with a lateral Zener diode formed between the N+ collector 255 and the P Base 240. The surface doping of the P Body is adjusted using a separate shallow P type implant to control the Zener breakdown voltage. The P anode terminal of the lateral Zener diode is shorted to the ground terminal using a shallow P+ implant 245. A separate metal 225 is used to contact the shallow P+ implant and connect it to the substrate via a N+ doped layer 220 and the N− epi layer 215.

In the output side, the substrate 210 includes a plurality of trenches 270'-1, 270'-2 and 270'-3 disposed in an N-epitaxial layer 215 supported on the N+ substrate 210. The trenches 270'-1 to 270'-3 with the epitaxial layer 215 are connected to the output voltage through metal contact 265'-1 to 265'-3 penetrates through an insulation layer 230'. The Zener diode is implemented using a vertical NPN transistor which is triggered by a lateral Zener diode. The collector of the NPN is formed by a N+ doped layer 255' and the base is formed by a P doped layer 240'. The emitter is formed by the N+ doped substrate 210. The trigger for the NPN is formed by a lateral Zener diode formed between the N+ collector 255' and the P Base 240'. The surface doping of the P Body is adjusted using a separate shallow P type implant to control the Zener breakdown voltage. The P anode terminal of the lateral Zener diode is shorted to the ground terminal using a shallow P+ implanted region 245'. A separate metal 225' is used to contact the shallow P+ implant and connect it to the substrate via a N+ doped layer 220' and the N− epi layer 215. The input and the output terminals 250 and 250' are interconnected with a series resistor formed by a polysilicon layer to function as a filter resistor between the input and the output terminals of the EMI-TVS device 200.

Again, the trenches 270-1 to 270-3 and 270'-1 to 270'-3 that function as MOS trench capacitors are padded with combined dielectric layers that includes a nitride dielectric layer 102 and an oxide dielectric layer 103 as that shown in FIG. 2A to increase the capacitance of the capacitors without requiring to increase the die size or increasing the total thickness of the dielectric layers.

In the EMI-TVS integrated device there is a direct capacitive coupling between the IO terminals 250 and 250' and GND terminal 205 without a floating body between them. The capacitance requires smaller area due to the fact that when there is a floating body in between, the net capacitance from IO terminal to the Ground terminal will be the series capacitance of the two junction capacitances, which will be much smaller than the individual junction capacitances. There is no sensitivity to the light or other changes of the environmental conditions because of the direct capacitive coupling, without the floating base. The filtering capacitance is therefore independent of the DC bias because of the symmetric capacitance for positive and negative bias. The constant capacitance provides special advantage in real applications, because the device with constant capacitance can pass the low frequency audio/data signal that can vary from +Vcc to −Vcc, over the entire range of the rated supply voltage for this device. The high frequency RF signal, which is supposed to be filtered by this device, will be over-riding on top of the low frequency signal. In contrast, if the filter capacitance varies as a function of voltage, the filter performance of the device also changes depending on the voltage level of the low frequency audio/data signal. The filter may achieve high attenuation of the RF signal as 0 Bias, but its attenuation will decrease significantly at +/−Vcc bias, if its capacitance decreases with bias. By implementing an asymmetrical EMI filter combined with a TVS circuit 200 of this invention, such difficulties are therefore resolved.

Figure 5:
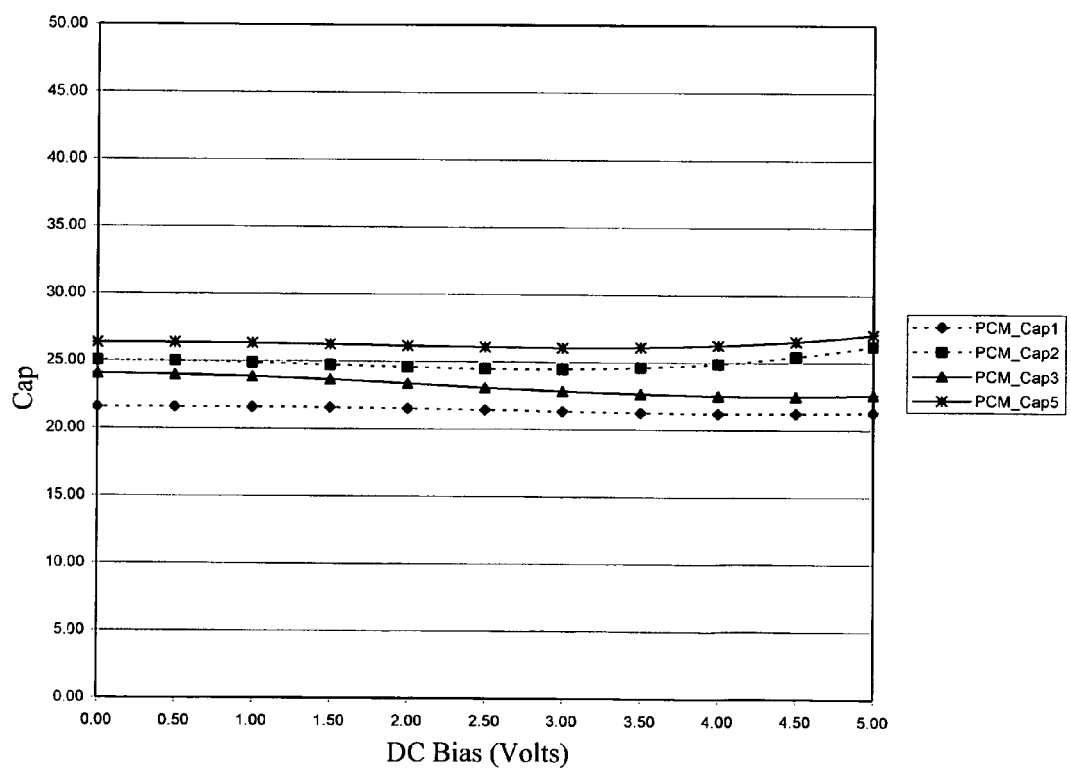
FIG. 5 is a diagram for showing the variation of capacitance versus DC bias voltage for a EMI-TVS device of FIG. 4.

FIG. 5 is a diagram for showing the variations of the capacitance versus the DC bias voltage. The capacitance is formed between the trench polysilicon to the N-epitaxial layer and N+ source regions in the MOS device in the accumulation mode. The capacitance doe not change with the voltage bias because for all positive biases, the N epitaxial layer is in accumulation mode, and the capacitance from the gate to substrate is the MOS oxide capacitance.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An electronic device protected by a bi-directional symmetric blocking transient voltage suppressing (TVS) circuit integrated with an electromagnetic interference (EMI) filter wherein:
   said TVS integrated with said EMI filter further comprising at least a Zener diode connected in parallel to a plurality of capacitors between an input terminal and a ground terminal wherein a total capacitance between said input terminal and said ground terminal having substantially a constant value when applying opposite bias voltages between said input terminal and said ground terminal; and
   said TVS integrated with said EMI filter is supported on a semiconductor substrate and said plurality of capacitors include a plurality of shallow trenches opened in semiconductor substrate filled with a dielectric material and said trenches are padded with a combined dielectric layers comprising a nitride dielectric layer and an oxide dielectric layer.

2. The electronic device of claim 1 wherein:
   said EMI filter further comprising a symmetrical filter having an equal number of capacitors connected to said input terminal and to said ground terminal.

3. The electronic device of claim 1 wherein:
   said EMI filter further comprising a symmetrical filter having an equal number of shallow trenches opened in said semiconductor substrate and padded with said combined dielectric layers comprising a nitride dielectric layer and an oxide dielectric layer for functioning as capacitors connected to said input terminal and to said ground terminal.

4. The electronic device of claim 1 wherein:
   said TVS integrated with said EMI filter is supported on a semiconductor substrate wherein said input terminal is formed in a first doped region in said semiconductor substrate and said ground terminal is formed in a second doped region in said semiconductor substrate; and
   said semiconductor substrate further including deep isolation trenches disposed between said first and second doped regions.

5. The electronic device of claim 1 wherein:
   said TVS integrated with said EMI filter is supported on a semiconductor substrate of a first conductivity type and said input terminal is formed in a first doped region in said semiconductor substrate and said ground terminal is formed in a second doped region in said semiconductor substrate wherein said first and second doped regions are doped with a second conductivity type whereby a first and second Zener diodes are formed between said first and second doped regions of said second conductivity type and said semiconductor substrate of said first conductivity type.

6. A transient voltage suppressing (TVS) circuit integrated with an electromagnetic interference (EMI) filter supported on a semiconductor substrate of a first conductivity type further comprising:
   a first and a second doped region of a second conductivity type for functioning with said semiconductor substrate of said first conductivity as first and second Zener diodes and a first and second sets of equal number of shallow trenches opened in said first and second doped regions filled with a dielectric material and polysilicon gate to function as MOS capacitors wherein said MOS capacitors are padded with a combined dielectric layers comprising a nitride dielectric layer and an oxide dielectric layer.

7. The TVS integrated with said EMI filter of claim 6 further comprising:
   a deep isolation trench disposed between said first and second doped regions.

8. The TVS integrated with said EMI filter of claim 6 further comprising:
   an input terminal comprising a first metal contact for electrically connecting said first doped region to an input voltage and a ground terminal comprising a second metal contact for electrically connecting said second doped region to a ground voltage.

9. The TVS integrated with said EMI filter of claim 6 further comprising:
   a third and a fourth doped regions of a second conductivity type for functioning with said semiconductor substrate of said first conductivity as third and fourth Zener diodes and a third and fourth sets of equal number of shallow trenches opened in said first and second doped regions filled with a dielectric material and padded with said combined dielectric layers comprising a nitride dielectric layer and an oxide dielectric layer to function as junction capacitors.

10. The TVS integrated with said EMI filter of claim 9 further comprising:
    a deep isolation trench disposed between said third and fourth doped regions.

11. The TVS integrated with said EMI filter of claim 6 further comprising:
    an output terminal comprising a third metal contact for electrically connecting said third doped region to an output voltage and a ground terminal comprising a fourth metal contact for electrically connecting said fourth doped region to a ground voltage wherein said fourth doped region disposed next to said second doped region.

12. A unidirectional blocking transient voltage suppressing (TVS) circuit integrated with an electromagnetic interference (EMI) filter supported on a semiconductor substrate of a first conductivity type further comprising:
    a ground terminal disposed on a bottom of said semiconductor substrate and an input and an output terminal disposed on a top surface with at least a Zener diode and a plurality of capacitors disposed in said semiconductor substrate to couple said ground terminal to said input and output terminals with a direct capacitive coupling without an intermediate floating body region; and,
    a first set of trenches, each padded with a combined dielectric layers comprising a nitride dielectric layer, and an oxide dielectric layer filled with dielectric material and a polysilicon gate and connected to an input terminal to form MOS capacitor between the input terminal and said ground terminal.

13. The TVS integrated with said EMI filter of claim 12 further comprising:
    a Zener diode connected in parallel between the input and ground terminal that is implemented as a vertical NPN transistor triggered by a lateral Zener diode, with the body of the NPN transistor also serving as the anode of the lateral Zener diode connected to the substrate thru a separate metal contact.

14. The TVS integrated with said EMI filter of claim 12 further comprising:
a second set of trenches, each padded with said combined dielectric layers comprising a nitride dielectric layer and an oxide dielectric layer, filled with dielectric material and a polysilicon gate and connected to an output terminal to form MOS capacitor between the output terminal and said ground terminal.

15. The TVS integrated with said EMI filter of claim 14 further comprising:
a Zener diode connected in parallel between the output and ground terminal that is implemented as a vertical NPN transistor triggered by a lateral Zener diode, with the body of the NPN transistor also serving as the anode of the lateral Zener diode connected to the substrate thru a separate metal contact.

16. A method for protecting an electronic device by a transient voltage suppressing (TVS) circuit integrated with an electromagnetic interference (EMI) filter comprising:
integrating said TVS with said EMI filter by connecting at least a Zener diode in parallel to a plurality of capacitors between an input terminal and a ground terminal and arranging a total capacitance between said input terminal and said ground terminal having substantially a constant value when applying opposite bias voltages between said input terminal and said ground terminal; and
forming said plurality of capacitors on a semiconductor substrate as a plurality of shallow trenches opened in said semiconductor substrate and padding trench walls of each of said trenches with a combined dielectric layers with a nitride dielectric layer and an oxide dielectric layer and filled said trenches with a dielectric material.

17. The method of claim 16 wherein:
said step of integrating said TVS with said EMI filter further comprising a step of integrating a symmetrical EMI filter by connecting an equal number of capacitors to said input terminal and to said ground terminal.

18. The method of claim 16 wherein:
said step of integrating said TVS with said EMI filter further comprising a step of forming said plurality of capacitors on a semiconductor substrate as a plurality of shallow trenches opened in said semiconductor substrate followed by padding trench walls of each of said trenches with a combined dielectric layers with a nitride dielectric layer and an oxide dielectric layer and filling said trenches with a dielectric material and connecting an equal number of shallow trenches opened in said semiconductor substrate for functioning as capacitors connected to said input terminal and to said ground terminal thus forming a symmetrical EMI filter connected to said TVS.

19. The method of claim 16 further comprising:
forming a first doped region in said semiconductor substrate for connecting to said input terminal and forming a second doped region in said semiconductor substrate for connecting to said ground terminal, and
forming deep isolation trenches in said semiconductor substrate between said first and second doped regions.

20. The method of claim 16 wherein:
said step of connecting said Zener diode in parallel to a plurality of capacitors further comprising a step of forming a first and a second doped regions of a second conductivity type in a semiconductor substrate of a first conductivity type constituting two Zener diodes between said first and second doped regions and said semiconductor substrate and opening a plurality trenches followed by padding trench walls of each of said trenches with a combined dielectric layers with a nitride dielectric layer and an oxide dielectric layer and filling said trenches with a dielectric material for forming a plurality of junction capacitors in said first and second doped regions and further connecting said first and second doped region to said input terminal and said ground terminal respectively.

21. The method of claim 20 wherein:
said step of opening said plurality of trenches in said first and second doped regions further comprising a step of opening an equal number of trenches in said first and second doped regions in said semiconductor substrate whereby a total amount of capacitance is kept at substantially constant value when reversed bias voltages are applied between said input terminal and said ground terminal.

22. The method of claim 16 further comprising:
forming a third and a fourth doped regions of a second conductivity type in a semiconductor substrate of a first conductivity type constituting a third and a fourth Zener diodes between said third and fourth doped regions and said semiconductor substrate and opening a plurality trenches followed by padding trench walls of each of said trenches with a combined dielectric layers with a nitride dielectric layer and an oxide dielectric layer and filling said trenches with a dielectric material for forming a plurality of junction capacitors in said third and fourth doped regions and further connecting said third and fourth doped regions to an output terminal and said ground terminal respectively.

23. The method of claim 22 wherein:
said step of opening said plurality of trenches in said third and fourth doped regions further comprising a step of opening an equal number of trenches in said third and fourth doped regions in said semiconductor substrate whereby a total amount of capacitance is kept at substantially constant value when reversed bias voltages are applied between said output terminal and said ground terminal.

* * * * *